United States Patent
Nishimura et al.

(10) Patent No.: US 12,419,182 B2
(45) Date of Patent: Sep. 16, 2025

(54) DISPLAY DEVICE INCLUDING A TRANSPARENT CONDUCTIVE LAYER COVERING OPTICAL ADJUSTMENT LAYERS

(71) Applicant: Magnolia White Corporation, Tokyo (JP)

(72) Inventors: Masumi Nishimura, Tokyo (JP); Hayata Aoki, Tokyo (JP); Hiroumi Kinjo, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 429 days.

(21) Appl. No.: 17/846,025

(22) Filed: Jun. 22, 2022

(65) Prior Publication Data

US 2022/0416209 A1    Dec. 29, 2022

(30) Foreign Application Priority Data

Jun. 24, 2021 (JP) ................. 2021-104902

(51) Int. Cl.
| | |
|---|---|
| *H10K 59/80* | (2023.01) |
| *H10K 50/81* | (2023.01) |
| *H10K 50/82* | (2023.01) |
| *H10K 50/852* | (2023.01) |
| *H10K 71/00* | (2023.01) |

(52) U.S. Cl.
CPC .......... *H10K 59/876* (2023.02); *H10K 50/81* (2023.02); *H10K 50/82* (2023.02); *H10K 50/852* (2023.02); *H10K 59/80522* (2023.02); *H10K 71/00* (2023.02)

(58) Field of Classification Search
CPC ...... H10K 50/852; H10K 50/81; H10K 50/82; H10K 71/00; H10K 59/80522; H10K 59/876; H10K 59/35
See application file for complete search history.

(56) References Cited

U.S. PATENT DOCUMENTS

2017/0104036 A1*  4/2017  Maeda ................... H10K 59/35
2019/0334112 A1* 10/2019  Lee ...................... H10K 71/221

FOREIGN PATENT DOCUMENTS

| JP | 2014-56666 A | 3/2014 | |
| WO | WO-2014041743 A1 * | 3/2014 | .......... H01L 27/3211 |

* cited by examiner

*Primary Examiner* — Fernando L Toledo
*Assistant Examiner* — Grace Cha
(74) *Attorney, Agent, or Firm* — XSENSUS LLP

(57) ABSTRACT

According to one embodiment, a display device includes a first bottom electrode, a second bottom electrode, a first organic layer covering the first bottom electrode, a second organic layer covering the second bottom electrode, a first top electrode covering the first organic layer, a second top electrode covering the second organic layer, a first optical adjustment layer disposed on the first top electrode, a second optical adjustment layer disposed on the second top electrode, and a transparent conductive layer covering the first optical adjustment layer and the second optical adjustment layer, and being in contact with the first top electrode and the second top electrode.

7 Claims, 7 Drawing Sheets

DISPLAY DEVICE INCLUDING A TRANSPARENT CONDUCTIVE LAYER COVERING OPTICAL ADJUSTMENT LAYERS

CROSS-REFERENCE TO RELATED APPLICATIONS

This application is based upon and claims the benefit of priority from Japanese Patent Application No. 2021-104902, filed Jun. 24, 2021, the entire contents of which are incorporated herein by reference.

FIELD

Embodiments described herein relate generally to a display device and a manufacturing method of the same.

BACKGROUND

Recently, a display device which applies an organic light emitting diode (OLED) as a display element has been put into practical use. The display element comprises an organic layer between a pixel electrode and a common electrode.

In a top emission display device, the application of a microcavity structure, which uses an optical resonant effect between a reflecting electrode as a pixel electrode and a semi-transparent electrode as a common electrode, is known. The microcavity structure is formed such that the optical path length between a pixel electrode and a common electrode conforms to the peak wavelength of emission spectrum in a display element which emits each of red light, green light and blue light. By this structure, only the light having a wavelength which conforms to the optical path length resonates, and thus, luminance and color purity are improved. In this microcavity structure, from the viewpoint of acquisition of a desired color chromaticity, it is important to weaken light having a wavelength which does not conform to the optical path length.

DETAILED DESCRIPTION

Figure 1:
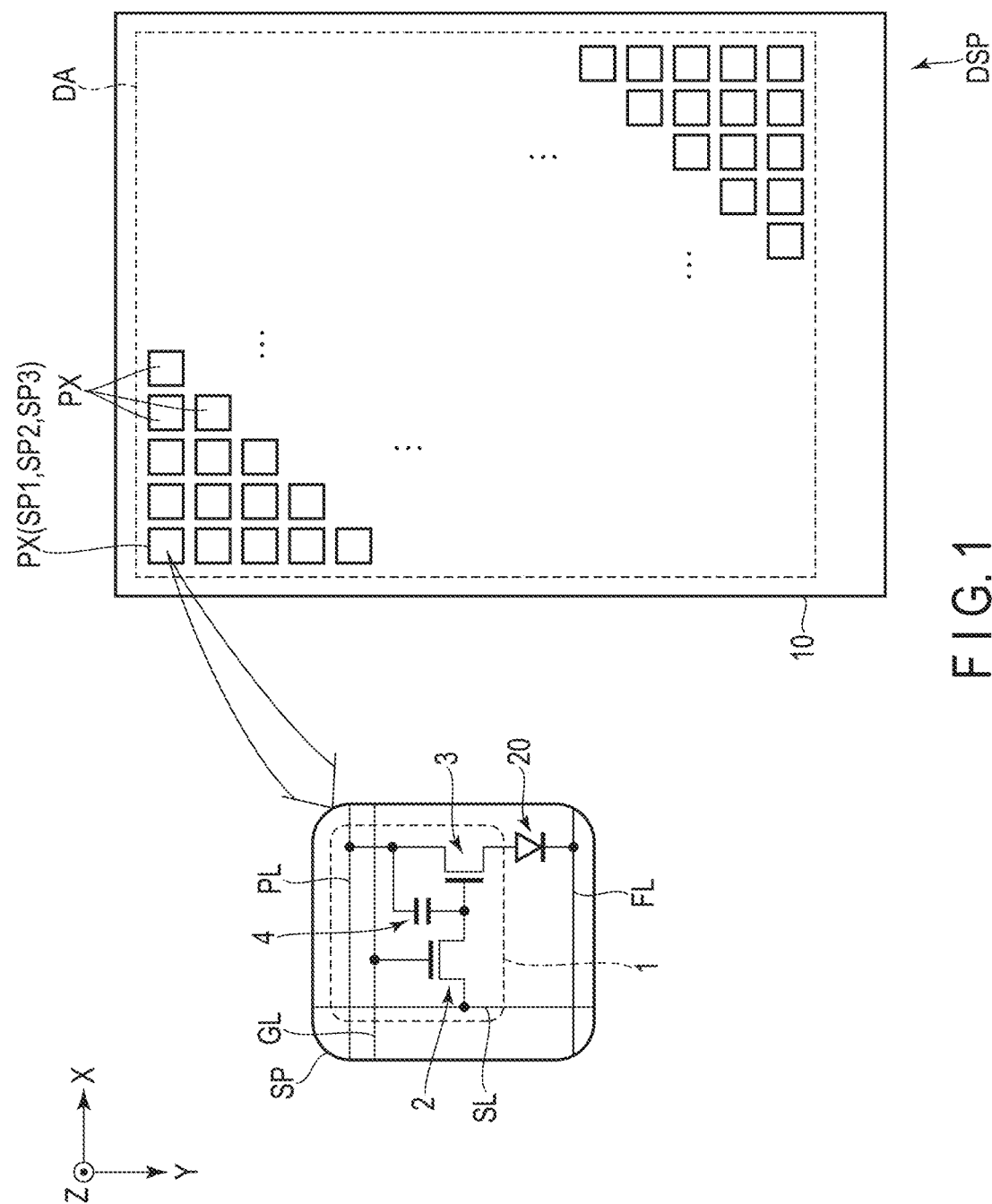
FIG. 1 shows a configuration example of a display device DSP according to an embodiment.

In general, according to one embodiment, a display device comprises a base material, a first insulating layer disposed on the base material, a first bottom electrode disposed on the first insulating layer and a second bottom electrode disposed on the first insulating layer, a second insulating layer disposed on the first insulating layer, and comprising a first opening portion overlapping the first bottom electrode and a second opening portion overlapping the second bottom electrode, a first organic layer including a first light emitting layer, disposed in the first opening portion, and covering the first bottom electrode, a second organic layer including a second light emitting layer, disposed in the second opening portion, and covering the second bottom electrode, a first top electrode which covers the first organic layer, a second top electrode which covers the second organic layer and is spaced apart from the first top electrode, a first optical adjustment layer disposed on the first top electrode, a second optical adjustment layer disposed on the second top electrode and spaced apart from the first optical adjustment layer, and a transparent conductive layer which covers the first optical adjustment layer and the second optical adjustment layer, is in contact with the first top electrode and the second top electrode, and electrically connecting the first top electrode and the second top electrode to each other.

According to another embodiment, a display device comprises a base material, a first insulating layer disposed on the base material, a first bottom electrode disposed on the first insulating layer and a second bottom electrode disposed on the first insulating layer, a feed line disposed on the first insulating layer and located between the first bottom electrode and the second bottom electrode, a second insulating layer disposed on the first insulating layer, and comprising a first opening portion overlapping the first bottom electrode, a second opening portion overlapping the second bottom electrode, and a contact hole penetrating such that the feed line is exposed, a first organic layer including a first light emitting layer, disposed in the first opening portion, and covering the first bottom electrode, a second organic layer including a second light emitting layer, disposed in the second opening portion, and covering the second bottom electrode, a first top electrode which covers the first organic layer and is in contact with the feed line in the contact hole, a second top electrode which covers the second organic layer, is spaced apart from the first top electrode, and is in contact with the feed line in the contact hole, a first optical adjustment layer disposed on the first top electrode, and a second optical adjustment layer disposed on the second top electrode and spaced apart from the first optical adjustment layer.

According to another embodiment, a display device comprises a base material, a first insulating layer disposed on the base material, a first bottom electrode disposed on the first insulating layer and a second bottom electrode disposed on the first insulating layer, a second insulating layer disposed on the first insulating layer, and comprising a first opening portion overlapping the first bottom electrode and a second opening portion overlapping the second bottom electrode, a first organic layer including a first light emitting layer, disposed in the first opening portion, and covering the first bottom electrode, a second organic layer including a second light emitting layer, disposed in the second opening portion, and covering the second bottom electrode, a first top electrode which covers the first organic layer, a second top electrode which covers the second organic layer and overlaps the first top electrode on the second insulating layer, a first optical adjustment layer disposed on the first top electrode, and a second optical adjustment layer disposed on the second top electrode and spaced apart from the first optical adjustment layer.

According to another embodiment, a manufacturing method of a display device comprises forming a first bottom electrode and a second bottom electrode on a first insulating layer, forming, on the first insulating layer, a second insulating layer comprising a first opening portion overlapping the first bottom electrode and a second opening portion overlapping the second bottom electrode, forming a first structure which is in contact with the first bottom electrode and covers the first opening portion, using the first structure as a mask so as to form a second organic layer in the second opening portion, form a second top electrode covering the second organic layer and further form a second optical adjustment layer on the second top electrode, forming a second structure covering the second optical adjustment layer after the first structure is removed, using the second structure as a mask so as to form a first organic layer in the first opening portion, form a first top electrode covering the first organic layer and further form a first optical adjustment layer on the first top electrode.

Embodiments are described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as an X-direction or a first direction. A direction parallel to the Y-axis is referred to as a Y-direction or a second direction. A direction parallel to the Z-axis is referred to as a Z-direction or a third direction. The plane defined by the X-axis and the Y-axis is referred to as an X-Y plane. When the X-Y plane is viewed, the appearance is defined as a plan view.

According to an embodiment, a display device DSP is an organic electroluminescent display device comprising an organic light emitting diode (OLED) as a display element, and is mounted on televisions, personal computers, mobile terminals, mobile phones and the like. It should be noted that the display element explained below can be applied as a light emitting element of an illumination device. The display device DSP can be used for another electronic device such as an illumination device.

FIG. 1 shows a configuration example of the display device DSP according to the present embodiment. The display device DSP comprises, on an insulating base material (substrate) 10, a display portion DA which displays an image. The base material 10 may be glass substrate or a resinous film having flexibility.

The display portion DA comprises a plurality of pixels PX arranged in matrix in a first direction X and a second direction Y. Each pixel PX comprises a plurality of subpixels SP1, SP2 and SP3. For example, each pixel PX comprises a red subpixel SP1, a green subpixel SP2 and a blue subpixel SP3. It should be noted that each pixel PX may comprise four or more subpixels. Specifically, in addition to the above three subpixels, each pixel PX may comprise a subpixel which exhibits another color, or more subpixels which exhibit other colors, such as white. A combination of colors other than the combination of red, green and blue may be employed.

Now, this specification briefly explains a configuration example of a subpixel SP included in a pixel PX.

The subpixel SP comprises a pixel circuit 1, and a display element 20 in which driving is controlled by the pixel circuit 1. The pixel circuit 1 comprises a pixel switch 2, a drive transistor 3 and a capacitor 4. The pixel switch 2 and the drive transistor 3 are, for example, switch elements constituted by thin-film transistors.

Regarding the pixel switch 2, a gate electrode is connected to a scanning line GL, and a source electrode is connected to a signal line SL, and a drain electrode is connected to an electrode of the capacitor 4 and to the gate electrode of the drive transistor 3. Regarding the drive transistor 3, a source electrode is connected to the other electrode of the capacitor 4 and to a power line PL, and a drain electrode is connected to the anode of the display element 20. The cathode of the display element 20 is connected to a feed line FL inside the display portion DA or outside the display portion DA. The configuration of the pixel circuit 1 is not limited to the example shown in the figure.

The display element 20 is an organic light emitting diode (OLED) which is a light emitting element. For example, the subpixel SP1 comprises a display element which emits light corresponding to a red wavelength. The subpixel SP2 comprises a display element which emits light corresponding to a green wavelength. The subpixel SP3 comprises a display element which emits light corresponding to a blue wavelength. Multicolor display can be realized since the pixel PX comprises a plurality of subpixels SP1, SP2 and SP3 having different display colors.

The display elements 20 of the subpixels SP1, SP2 and SP3 may be configured to emit the light of the same color. This configuration enables monochromatic display.

When the display element 20 of each of the subpixels SP1, SP2 and SP3 is configured to emit white light, a color filter facing each display element 20 may be provided. For example, the subpixel SP1 comprises a red color filter facing the display element 20. The subpixel SP2 comprises a green color filter facing the display element 20. The subpixel SP3 comprises a blue color filter facing the display element 20. By this configuration, multicolor display can be realized.

Alternatively, when the display element 20 of each of the subpixels SP1, SP2 and SP3 is configured to emit ultraviolet light, multicolor display can be realized by providing a light conversion layer facing each display element 20.

Figure 2:
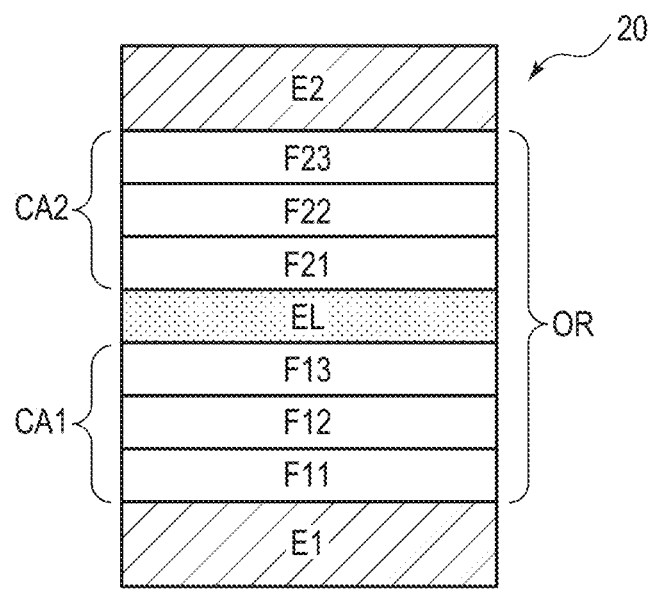
FIG. 2 shows an example of the configuration of a display element 20.

FIG. 2 shows an example of the configuration of the display element 20.

The display element 20 comprises a bottom electrode (first electrode) E1, an organic layer OR and a top electrode (second electrode) E2. The organic layer OR is disposed on the bottom electrode E1. The top electrode E2 is disposed on the organic layer OR. The organic layer OR comprises a carrier adjustment layer CA1, a light emitting layer EL and a carrier adjustment layer CA2. The carrier adjustment layer CA1 is located between the bottom electrode E1 and the light emitting layer EL. The carrier adjustment layer CA2 is located between the light emitting layer EL and the top electrode E2. The carrier adjustment layers CA1 and CA2 include a plurality of functional layers.

Here, this specification explains an example in which the bottom electrode E1 corresponds to an anode and the top electrode E2 corresponds to a cathode.

The carrier adjustment layer CA1 includes a hole injection layer F11, a hole transport layer F12, an electron blocking layer F13 and the like as functional layers. The hole injection layer F11 is disposed on the bottom electrode E1. The hole transport layer F12 is disposed on the hole injection layer F11. The electron blocking layer F13 is disposed on the hole transport layer F12. The light emitting layer EL is disposed on the electron blocking layer F13.

The carrier adjustment layer CA2 includes a hole blocking layer F21, an electron transport layer F22, an electron injection layer F23 and the like as functional layers. The hole blocking layer F21 is disposed on the light emitting layer EL. The electron transport layer F22 is disposed on the hole blocking layer F21. The electron injection layer F23 is disposed on the electron transport layer F22. The top electrode E2 is disposed on the electron injection layer F23.

In addition to the functional layers described above, the carrier adjustment layers CA1 and CA2 may include other functional layers such as a carrier generation layer as needed, or at least one of the above functional layers may be omitted in the carrier adjustment layers CA1 and CA2.

Figure 3:
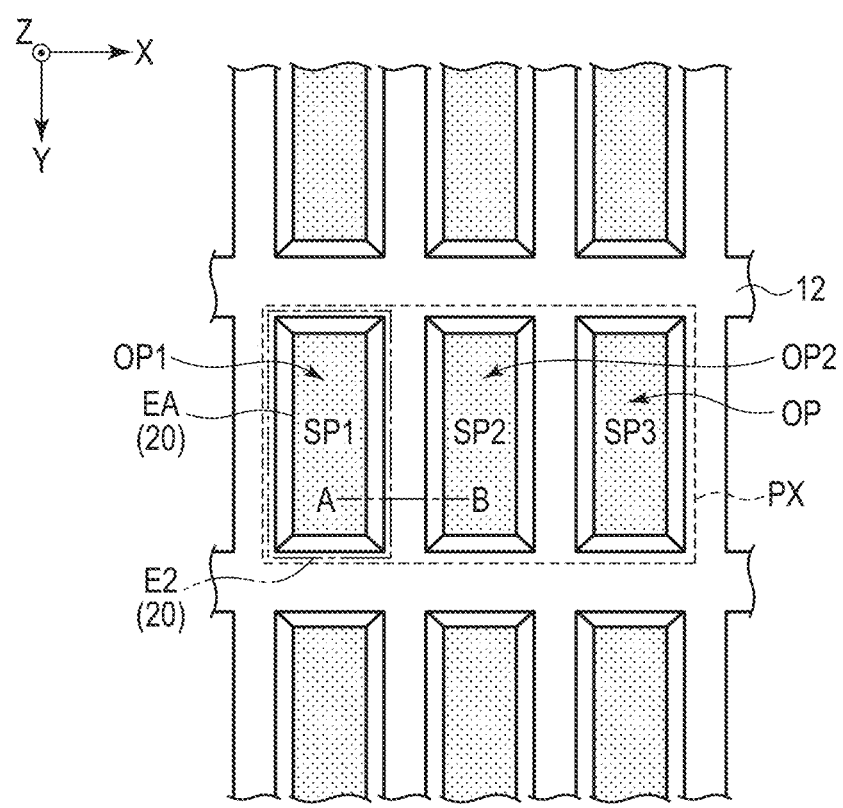
FIG. 3 is a plan view showing an example of each pixel PX shown in FIG. 1.

FIG. 3 is a plan view showing an example of each pixel PX shown in FIG. 1.

Each of the subpixels SP1, SP2 and SP3 which constitute a pixel PX is formed in substantially a rectangular shape extending in the second direction Y. The subpixels SP1, SP2 and SP3 are arranged in the first direction X. The outline of each subpixel corresponds to the outline of an emitting area EA in the display element 20. However, the outline is shown in a simplified manner and does not necessarily reflect the actual shape. Here, it is assumed that the emitting area EA is formed in a rectangular shape having short sides extending in the first direction X and long sides extending in the second direction Y.

As seen in plan view, an insulating layer 12 which is described in detail later is formed in a grating shape extending in the first direction X and the second direction Y, and surrounds each of the subpixels SP1, SP2 and SP3 or the display element 20 of each subpixel. Such an insulating layer 12 may be referred to as a rib, partition, bank and the like. The insulating layer 12 comprises a plurality of opening portions OP including opening portions OP1 and OP2. The emitting areas EA are formed in the opening portions OP of the insulating layer 12, and correspond to an area where the organic layer OR intervenes between the bottom electrode E1 and the top electrode E2. The opening portions OP are arranged in matrix in the first direction X and the second direction Y.

The top electrode E2 of each display element 20 overlaps the emitting area EA as shown with the alternate long and short dash lines. Predetermined potential is supplied to the top electrode E2 from a feed line which is not described in detail.

Figure 4:
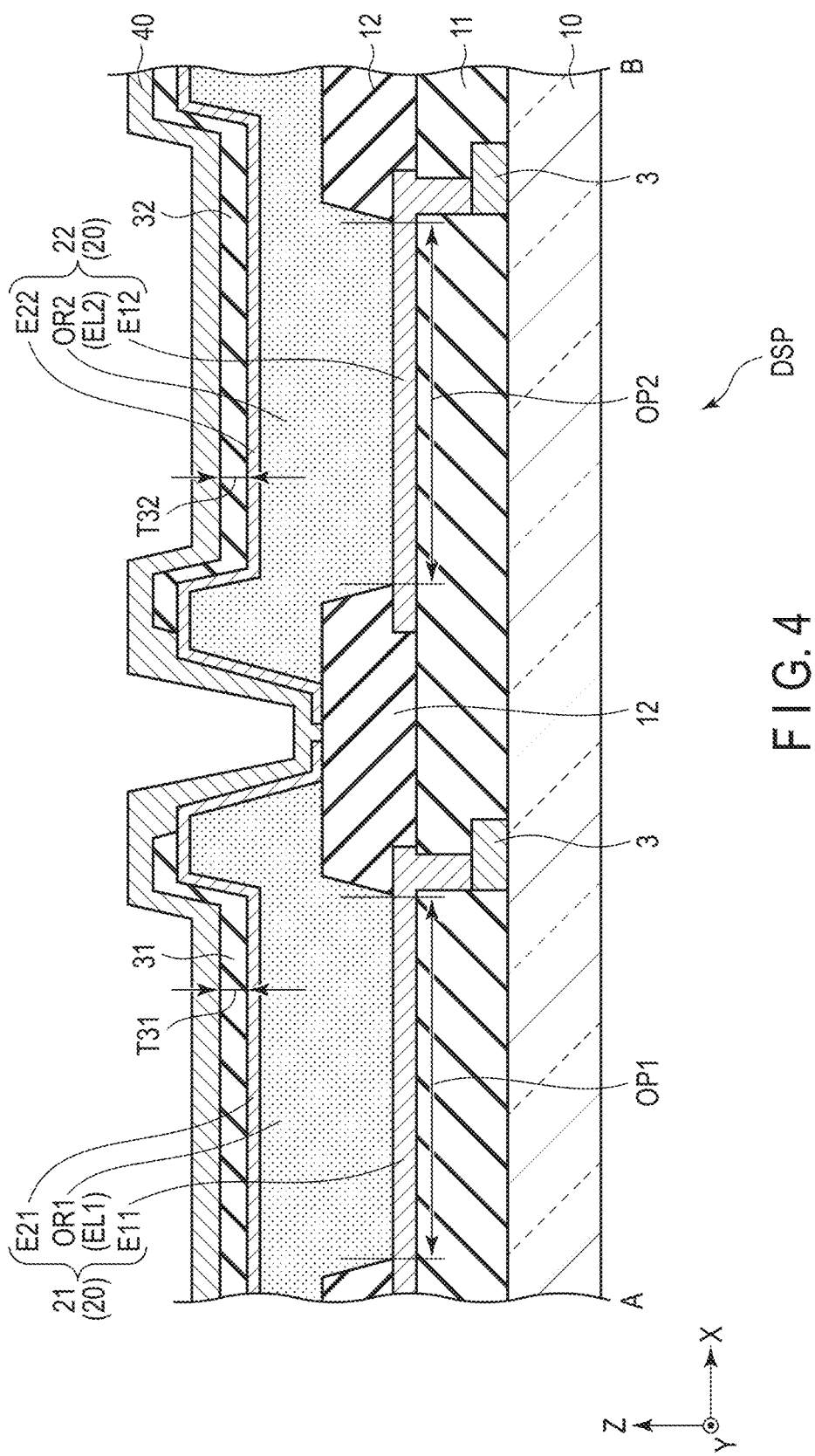
FIG. 4 is a cross-sectional view showing a configuration example of the display device DSP along the A-B line shown in FIG. 3.

FIG. 4 is a cross-sectional view showing a configuration example of the display device DSP along the A-B line shown in FIG. 3.

The display device DSP comprises the base material 10, an insulating layer (first insulating layer) 11, the insulating layer (second insulating layer) 12 and a plurality of display elements 20.

The insulating layer 11 is disposed on the base material 10 and corresponds to an underlayer of the display elements 20. The pixel circuit 1 shown in FIG. 1 is disposed on the base material 10 and is covered with the insulating layer 11. Here, of the pixel circuit 1, only the drive transistor 3 is illustrated in a simplified manner. The insulating layer 12 is disposed on the insulating layer 11.

We now focus on two display elements 20 adjacent to each other in the first direction X. For convenience, the display element located on the left side of the figure is denoted as a display element 21, and the display element located on the right side of the figure is denoted as a display element 22.

The display element 21 comprises a bottom electrode (first bottom electrode) E11, an organic layer (first organic layer) OR1 and a top electrode (first top electrode) E21.

The display element 22 comprises a bottom electrode (second bottom electrode) E12, an organic layer (second organic layer) OR2 and a top electrode (second top electrode) E22.

The bottom electrodes E11 and E12 are disposed on the insulating layer 11, and are arranged at an interval in the first direction X. The bottom electrodes E11 and E12 are electrodes arranged for respective subpixels or display elements, and are electrically connected to the drive transistors 3. These bottom electrodes E11 and E12 may be referred to as pixel electrodes, anodes, etc.

The bottom electrodes E11 and E12 are transparent electrodes formed of, for example, a transparent conductive material such as indium tin oxide (ITO) or indium zinc oxide (IZO). The bottom electrodes E11 and E12 may be metal electrodes formed of a metal material such as silver or aluminum. Alternatively, the bottom electrodes E11 and E12 may be stacked layer bodies of transparent electrodes and metal electrodes. For example, the bottom electrodes E11 and E12 may be configured as stacked layer bodies formed by stacking a transparent electrode, a metal electrode and a transparent electrode in order, or may be configured as stacked layer bodies of four or more layers. In a top emission display element, the bottom electrodes E11 and E12 include a metal electrode as a reflecting electrode.

The insulating layer 12 is disposed between the bottom electrode E11 and the bottom electrode E12. The insulating layer 12 comprises the opening portion (first opening portion) OP1 and the opening portion (second opening portion) OP2. The insulating layer 12 is formed so as to define the subpixels or display elements 21 and 22. The insulating layer 12 is, for example, an inorganic insulating layer formed of a silicon nitride and the like.

The opening portion OP1 is formed in an area overlapping the bottom electrode E11, and is a through-hole which penetrates the insulating layer 12 such that the bottom electrode E11 is exposed from the insulating layer 12. The peripheral portion of the bottom electrode E11 is covered with the insulating layer 12. The central portion of the bottom electrode E11 is exposed from the insulating layer 12 in the opening portion OP1.

The opening portion OP2 is formed in an area overlapping the bottom electrode E12, and is a through-hole which penetrates the insulating layer 12 such that the bottom electrode E12 is exposed from the insulating layer 12. The peripheral portion of the bottom electrode E12 is covered with the insulating layer 12. The central portion of the bottom electrode E12 is exposed from the insulating layer 12 in the opening portion OP2.

The organic layer OR1 is disposed in the opening portion OP1 and covers the bottom electrode E11. The organic layer OR2 is disposed in the opening portion OP2 and covers the bottom electrode E12. In the example shown in FIG. 4, a part of the organic layer OR1 and a part of the organic layer OR2 are also disposed on the insulating layer 12. Each of these organic layers OR1 and OR2 is arranged for a subpixel or display element in a manner similar to that of the bottom electrodes E11 and E12. On the insulating layer 12, the organic layer OR2 is spaced apart from the organic layer OR1.

The organic layer OR1 includes a light emitting layer (first light emitting layer) EL1. The organic layer OR2 includes a light emitting layer (second light emitting layer) EL2. For example, the light emitting layer EL1 is formed of a material different from that of the light emitting layer EL2. The emission spectrum of the light emitting layer EL1 is different from the emission spectrum of the light emitting layer EL2. For this reason, the emitting color of the organic layer OR1 is different from the emitting color of the organic layer OR2. It should be noted that the light emitting layers EL1 and EL2 may be formed of the same material. In this case, the emitting color of the organic layer OR1 is the same as the organic layer OR2.

The top electrode E21 is disposed on the organic layer OR1 and covers the entire part of the organic layer OR1 including the peripheral portion of the organic layer OR1. The top electrode E21 is in contact with the insulating layer 12 outside the organic layer OR1. Of the organic layer OR1, a portion located between the bottom electrode E11 and the top electrode E21 without intervention of the insulating layer 12 is configured to form an emitting area of the display element 21. Of the organic layer OR1, a portion located between the insulating layer 12 and the top electrode E21 hardly emits light.

The top electrode E22 is disposed on the organic layer OR2 and covers the entire part of the organic layer OR2 including the peripheral portion of the organic layer OR2. The top electrode E22 is in contact with the insulating layer 12 outside the organic layer OR2. Of the organic layer OR2, a portion located between the bottom electrode E12 and the top electrode E22 without intervention of the insulating layer 12 is configured to form an emitting area of the display element 22. Of the organic layer OR2, a portion located between the insulating layer 12 and the top electrode E22 hardly emits light.

Each of these top electrodes E21 and E22 is an electrode arranged for a subpixel or display element. The top electrode E22 is spaced apart from the top electrode E21. The top electrodes E21 and E22 face each other at an interval in the first direction X on the insulating layer 12. These top electrodes E21 and E22 may be referred to as common electrodes, counter-electrodes, cathodes, etc.

The top electrodes E21 and E22 are, for example, semitransparent metal electrodes formed of a metal material such as magnesium or silver. The top electrodes E21 and E22 may be transparent electrodes formed of a transparent conductive material such as ITO or IZO. Alternatively, the top electrodes E21 and E22 may be stacked layer bodies of transparent electrodes and metal electrodes. The top electrodes E21 and E22 are electrically connected to a feed line disposed in the display portion DA or a feed line disposed outside the display portion DA.

For example, the thickness of the organic layer OR1 in a third direction Z is set such that the peak wavelength of the emission spectrum in the light emitting layer EL1 conforms to the effective optical path length between the bottom electrode E11 and the top electrode E21. This configuration enables a microcavity structure for obtaining a resonant effect. Similarly, the thickness of the organic layer OR2 in the third direction Z is set such that the peak wavelength of the emission spectrum in the light emitting layer EL2 conforms to the effective optical path length between the bottom electrode E12 and the top electrode E22.

An optical adjustment layer (first optical adjustment layer) 31 is disposed on the top electrode E21. The optical adjustment layer 31 is disposed so as to be in contact with the whole surface of the top electrode E21 directly above at least the opening portion OP1. In the example shown in the figure, the peripheral portion of the top electrode E21 is exposed from the optical adjustment layer 31.

An optical adjustment layer (second optical adjustment layer) 32 is disposed on the top electrode E22. The optical adjustment layer 32 is disposed so as to be in contact with the whole surface of the top electrode E22 directly above at least the opening portion OP2. In the example shown in the figure, the peripheral portion of the top electrode E22 is exposed from the optical adjustment layer 32. The optical adjustment layer 32 is spaced apart from the optical adjustment layer 31.

These optical adjustment layers 31 and 32 are provided to improve the light extraction efficiency from the display elements 21 and 22, respectively. The thickness and refractive index of the optical adjustment layers 31 and 32 are selected based on the emission intensity and emission spectrum of the light emitting layers EL1 and EL2. When the emission spectrum of the light emitting layer EL1 is different from that of the light emitting layer EL2, the thickness T31 of the optical adjustment layer 31 in the third direction Z is different from the thickness T32 of the optical adjustment layer 32 in the third direction Z.

These optical adjustment layers 31 and 32 are formed of a transparent material having a high refractive index. The optical adjustment layers 31 and 32 may be formed of a conductive material, an inorganic insulating material or an organic insulating material.

A transparent conductive layer 40 covers the optical adjustment layers 31 and 32, and is in contact with the peripheral portion of the top electrode E21 and the peripheral portion of the top electrode E22, and is provided such that the top electrode E21 is electrically connected to the top electrode E22. This transparent conductive layer 40 is formed of a transparent conductive material such as ITO or IZO. The transparent conductive layer 40 is in contact with the insulating layer 12 between the top electrode E21 and the top electrode E22.

The display elements 21 and 22 and the optical adjustment layers 31 and 32 are covered with a sealing film which is omitted in the figure. The sealing film is provided to protect the display elements 21 and 22 from moisture, etc., and is, for example, a stacked layer body of an inorganic insulating layer and an organic insulating layer.

As explained above, the optical adjustment layers 31 and 32 having optimal thicknesses are stacked on the display elements 21 and 22, respectively. Thus, the extraction efficiency of the light emitted from each of the display elements 21 and 22 can be improved. In addition, the optical adjustment layers 31 and 32 are provided in the emitting areas EA in the display elements 21 and 22, in other words, areas overlapping the opening portions OP1 and OP2 of the insulating layer 12. Because of this configuration, of the light emitted from the display elements 21 and 22, the light which underwent a resonant effect and has a predetermined wavelength is extracted. Thus, the luminance and color purity of the display light can be improved.

Now, an example of a manufacturing method of the display device DSP shown in FIG. 4 is explained with reference to FIG. 5 and FIG. 6.

Figure 5:
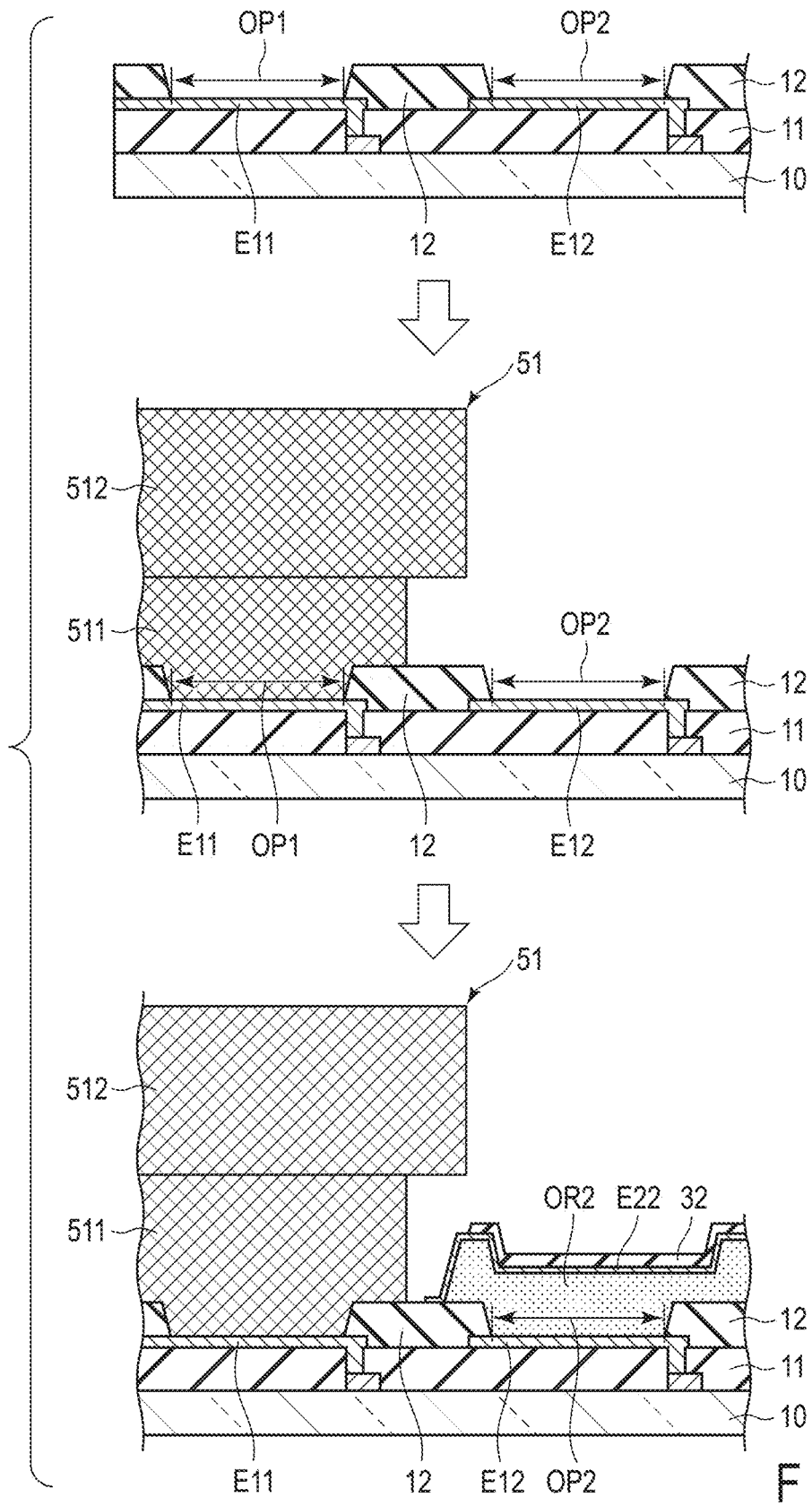
FIG. 5 is shown for explaining a manufacturing method of the display device DSP.
Figure 6:
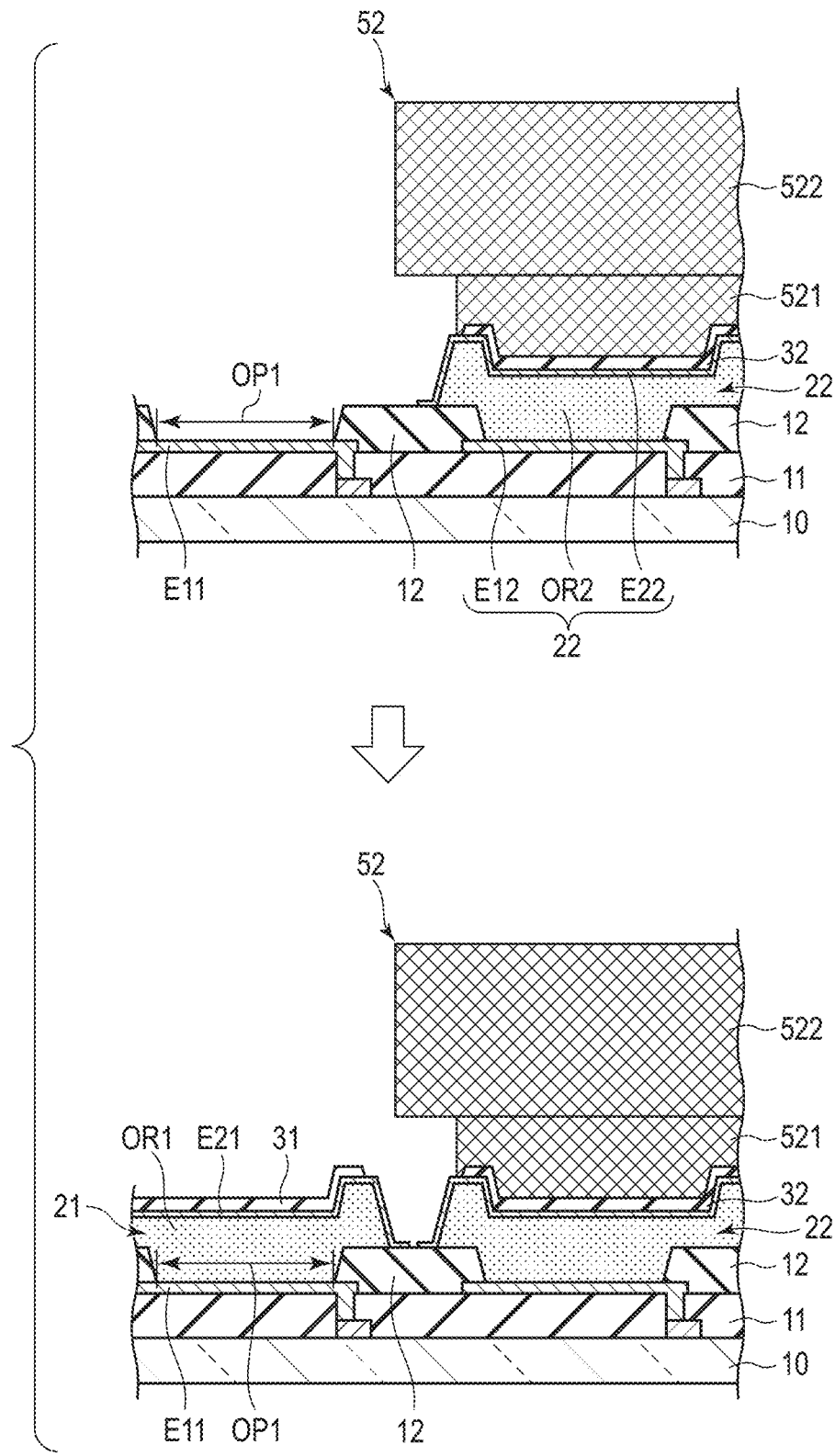
FIG. 6 is shown for explaining the manufacturing method of the display device DSP.

As shown in the upper part of FIG. 5, the pixel circuit 1 and the like shown in FIG. 1 are formed on the base material 10, and then the insulating layer 11 is formed. Subsequently, a conductive material is formed on the insulating layer 11. Subsequently, this conductive material is patterned in a predetermined shape, thereby forming the bottom electrodes E11 and E12. Subsequently, the insulating layer 12 covering the insulating layer 11 and the bottom electrodes E11 and E12 is formed. Subsequently, the opening portions OP1 and OP2 are formed in the insulating layer 12.

Subsequently, as shown in the middle part of the figure, a structure (first structure) 51 which is in contact with the bottom electrode E11 and covers the opening portion OP1 is formed. The structure 51 comprises a first layer 511 and a second layer 512. The second layer 512 extends from the first layer 511 toward the opening portion OP2.

Subsequently, as shown in the lower part of the figure, the organic layer OR2 is formed in the opening portion OP2, using the structure 51 as a mask. Subsequently, using the structure 51 as a mask, the top electrode E22 covering the organic layer OR2 is formed, and then the optical adjustment layer 32 is formed on the top electrode E22.

The organic layer OR2 is formed by, for example, a vacuum deposition method. At this time, vapor from an evaporation source passes through the area where the structure 51 does not exist, and reaches the upper side of the bottom electrode E12 and the insulating layer 12. Vapor from the evaporation source does not reach the shadow area of the structure 51.

The top electrode E22 is formed by, for example, a vacuum deposition method. At this time, vapor from an evaporation source passes through the area where the structure 51 does not exist, goes around to the part under the structure 51, and reaches the upper side of the organic layer OR2 and the insulating layer 12.

The optical adjustment layer 32 is formed by, for example, a vacuum deposition method. At this time, vapor from an evaporation source passes through the area where the structure 51 does not exist, and reaches the upper side of the top electrode E22.

In this way, the organic layer OR2, the top electrode E22 and the optical adjustment layer 32 are formed in series, using the structure 51 as a mask. After the optical adjustment layer 32 is formed, the structure 51 is removed, and the bottom electrode E11 is exposed from the opening portion OP1.

Subsequently, as shown in the upper part of FIG. 6, a structure (second structure) 52 which covers the optical adjustment layer 32 is formed. The structure 52 overlaps the display element 22. The structure 52 comprises a first layer 521 and a second layer 522. The second layer 522 extends from the first layer 521 toward the opening portion OP1.

Subsequently, as shown in the lower part of the figure, the organic layer OR1 is formed in the opening portion OP1, using the structure 52 as a mask. Subsequently, using the structure 52 as a mask, the top electrode E21 covering the organic layer OR1 is formed, and then the optical adjustment layer 31 is formed on the top electrode E21.

The organic layer OR1 is formed by, for example, a vacuum deposition method, in a manner similar to that of the organic layer OR2.

The top electrode E21 is formed by, for example, a vacuum deposition method, in a manner similar to that of the top electrode E22. At this time, vapor from an evaporation source passes through the area where the structure 52 does not exist, goes around to the part under the structure 52, and reaches the upper side of the organic layer OR1 and insulating layer 12.

The optical adjustment layer 31 is formed by, for example, a vacuum deposition method, in a manner similar to that of the optical adjustment layer 32.

In this way, the organic layer OR1, the top electrode E21 and the optical adjustment layer 31 are formed in series, using the structure 52 as a mask. After the optical adjustment layer 31 is formed, the structure 52 is removed.

As explained above, the organic layer OR1 and the top electrode E21 of the display element 21 and the organic layer OR2 and the top electrode E22 of the display element 22 are formed without applying a fine mask. This configuration reduces the production cost compared to the case where a fine mask is applied, and also eliminates the need for processes such as fine mask alignment. Thus, the display elements 21 and 22 can be easily formed in a desired shape. In addition, in the display elements 21 and 22, an emitting area can be formed in a predetermined area. Furthermore, undesired light emission in an area overlapping the insulating layer 12 is suppressed.

Now, another configuration example is explained.

Figure 7:
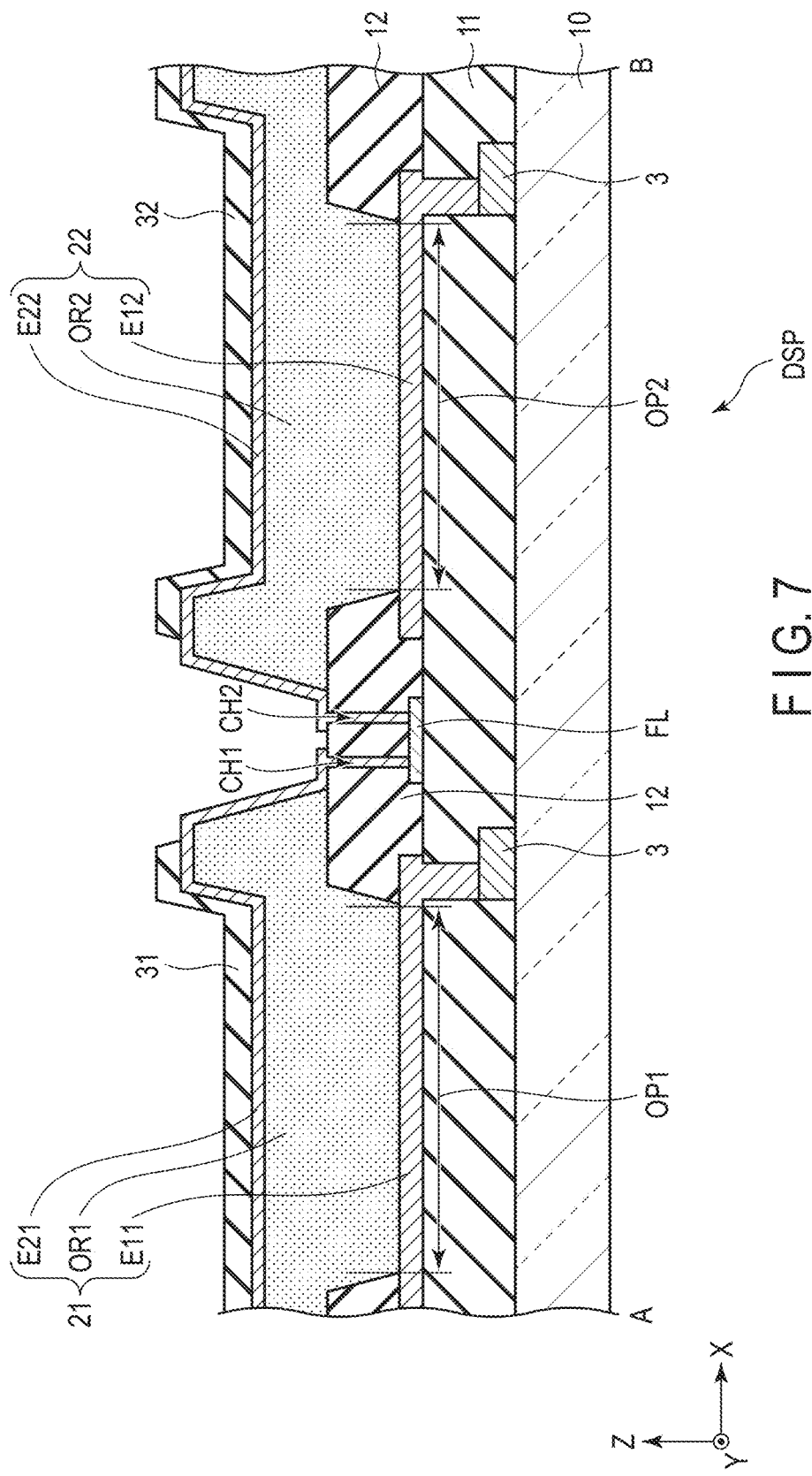
FIG. 7 is a cross-sectional view showing another configuration example of the display device DSP along the A-B line shown in FIG. 3.

FIG. 7 is a cross-sectional view showing another configuration example of the display device DSP along the A-B line shown in FIG. 3.

The configuration example shown in FIG. 7 is different from the configuration example shown in FIG. 4 in respect that the top electrodes E21 and E22 spaced apart from each other are electrically connected to the feed line FL. The feed line FL is disposed on the insulating layer 11 and is located between the bottom electrode E11 and the bottom electrode E12. It should be noted that the feed line FL is spaced apart from the bottom electrodes E11 and E12. The feed line FL is covered with the insulating layer 12. Contact holes CH1 and CH2 penetrating such that the feed line FL is exposed are formed in the insulating layer 12.

The top electrodes E21 and E22 face each other at an interval in the first direction X on the insulating layer 12. The top electrode E21 is in contact with the feed line FL in the contact hole CH1. The top electrode E22 is in contact with the feed line FL in the contact hole CH2.

In the example shown in FIG. 7, the top electrodes E21 and E22 are electrically connected to the common feed line FL. However, the configuration is not limited to this example. For example, when different voltages are applied to the top electrodes E21 and E22, respectively, two feed lines are disposed between the insulating layer 11 and the insulating layer 12. The top electrodes E21 and E22 are electrically connected to the respective feed lines.

Figure 8:
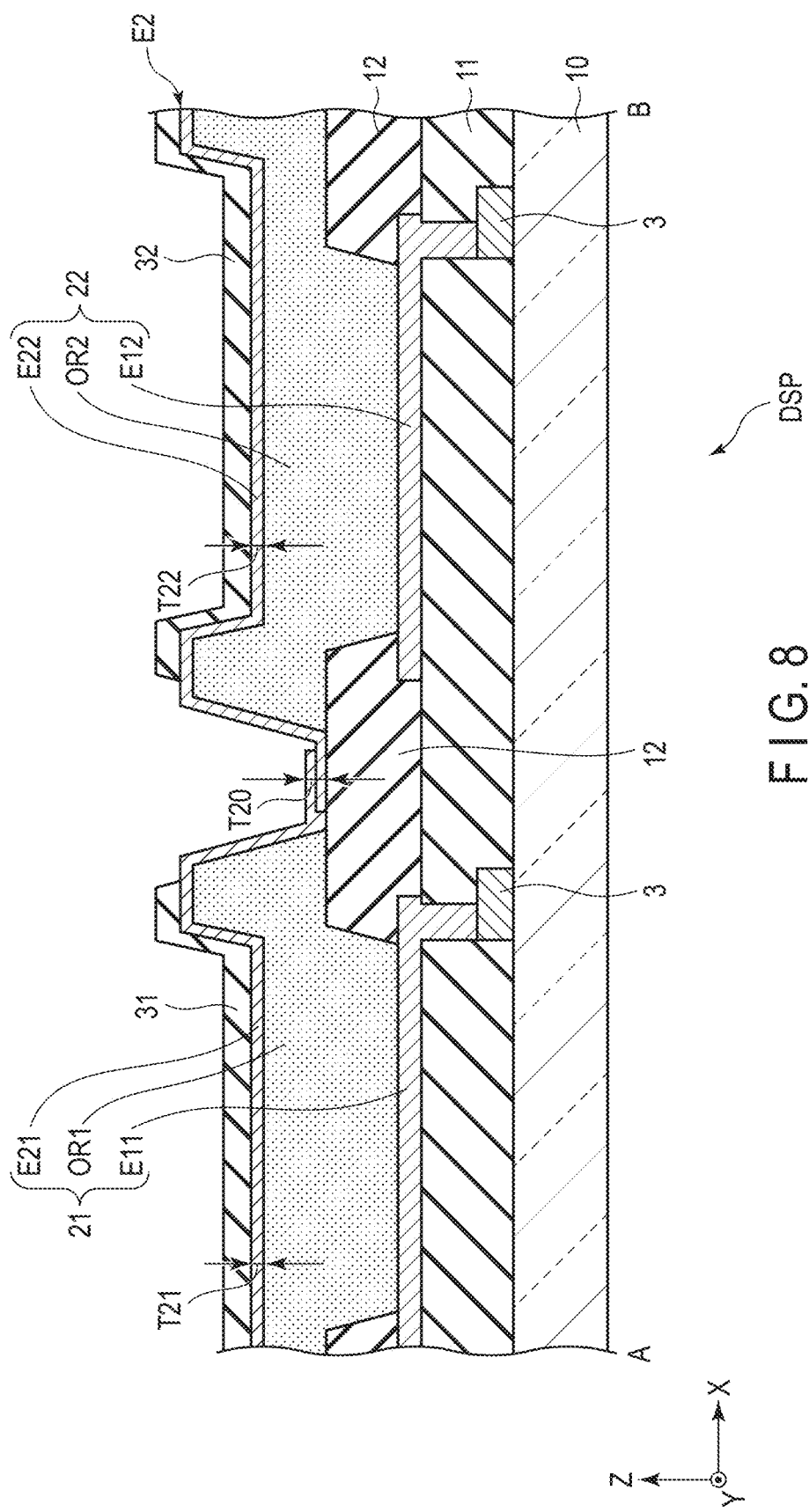
FIG. 8 is a cross-sectional view showing another configuration example of the display device DSP along the A-B line shown in FIG. 3.

FIG. 8 is a cross-sectional view showing another configuration example of the display device DSP along the A-B line shown in FIG. 3.

The configuration example shown in FIG. 8 is different from the configuration example shown in FIG. 4 in respect that the top electrode E21 overlaps the top electrode E22 on the insulating layer 12. As seen in plan view, in the display elements 21 and 22 which are adjacent to each other, a common top electrode E2 is formed like a single sheet.

The thickness T21 of the top electrode E21 between the optical layer OR1 and the optical adjustment layer 31 is equivalent to the thickness T22 of the top electrode E22 between the organic layer OR2 and the optical adjustment layer 32. The thickness T20 of the top electrode E2 on the insulating layer 12 is equivalent to the sum of the thickness T21 and the thickness T22 (or to twice the thickness T21).

When the display device DSP of each of the configuration examples shown in FIG. 7 and FIG. 8 is manufactured, the manufacturing method explained with reference to FIG. 5 and FIG. 6 can be applied.

In each of the configuration examples shown in FIG. 7 and FIG. 8, effects similar to the effects described above can be obtained.

The embodiment described above enables the provision of a display device which can improve the extraction efficiency of the light emitted from a display element, and a manufacturing method of the same.

All of the display devices that can be implemented by a person of ordinary skill in the art through arbitrary design changes to the display device described above as the embodiment of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiment by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiment and are self-explanatory from the descriptions of the specification or can be arbitrarily conceived by a person of ordinary skill in the art are considered as the effects of the present invention as a matter of course.

What is claimed is:

1. A display device comprising:
    a base material;
    a first insulating layer disposed on the base material;
    a first bottom electrode disposed on the first insulating layer and a second bottom electrode disposed on the first insulating layer;
    a second insulating layer disposed on the first insulating layer, and comprising a first opening portion overlapping the first bottom electrode and a second opening portion overlapping the second bottom electrode;
    a first organic layer including a first light emitting layer, disposed in the first opening portion, and covering the first bottom electrode;
    a second organic layer including a second light emitting layer, disposed in the second opening portion, and covering the second bottom electrode;
    a first top electrode covering the first organic layer;
    a second top electrode covering the second organic layer and spaced apart from the first top electrode;
    a first optical adjustment layer disposed on the first top electrode;
    a second optical adjustment layer disposed on the second top electrode and spaced apart from the first optical adjustment layer; and
    a transparent conductive layer covering the first optical adjustment layer and the second optical adjustment layer, being in contact with the first top electrode and the second top electrode, and electrically connecting the first top electrode and the second top electrode to each other, wherein
    each of the first organic layer and the second organic layer is thicker than the second insulating layer,
    the first top electrode and the second top electrode face each other at an interval on the second insulating layer, and
    the transparent conductive layer is in direct contact with the second insulating layer between the first top electrode and the second top electrode.

2. The display device of claim 1, wherein
    an emission spectrum of the first light emitting layer is different from an emission spectrum of the second light emitting layer, and
    a thickness of the first optical adjustment layer is different from a thickness of the second optical adjustment layer.

3. The display device of claim 1, wherein
    the second insulating layer is an inorganic insulating layer.

4. The display device of claim 1, wherein
    the transparent conductive layer covers an end surface of the first optical adjustment layer and an end surface of the second optical adjustment layer directly above the second insulating layer.

5. The display device of claim 1, wherein
    the first organic layer includes a first side surface on the second insulating layer,
    the second organic layer includes a second side surface on the second insulating layer,
    the first top electrode covers the first side surface, and
    the second top electrode covers the second side surface.

6. The display device of claim 5, wherein
    a part of the first side surface and a part of the second side surface face each other and form a recess portion.

7. The display device of claim 6, wherein
    the transparent conductive layer is disposed in the recess portion and covers the first top electrode and the second top electrode.

* * * * *